(12) United States Patent
Klug et al.

(10) Patent No.: US 8,083,912 B2
(45) Date of Patent: Dec. 27, 2011

(54) SUBSTRATE CARRIER

(75) Inventors: Thomas Klug, Grossostheim (DE); Oliver Heimel, Wabern (DE)

(73) Assignee: Applied Materials GmbH & Co. KG., Alzenau (DE)

( * ) Notice: Subject to any disclaimer, the term of this patent is extended or adjusted under 35 U.S.C. 154(b) by 1220 days.

(21) Appl. No.: 11/254,426

(22) Filed: Oct. 20, 2005

(65) Prior Publication Data

US 2007/0069351 A1 Mar. 29, 2007

(30) Foreign Application Priority Data

Sep. 24, 2005 (DE) .................. 10 2005 045 718

(51) Int. Cl.
- C25B 9/00 (2006.01)
- C25B 11/00 (2006.01)
- C25B 13/00 (2006.01)
- C23C 14/00 (2006.01)
- C23C 16/00 (2006.01)

(52) U.S. Cl. .................. 204/298.15; 118/728

(58) Field of Classification Search ............ 204/298.15, 204/298.23; 118/728
See application file for complete search history.

(56) References Cited

U.S. PATENT DOCUMENTS

| | | | |
|---|---|---|---|
| 6,082,298 A | 7/2000 | Suter | |
| 6,623,563 B2 * | 9/2003 | Hosokawa | ............ 118/728 |
| 2005/0142290 A1 | 6/2005 | Kempf et al. | |

FOREIGN PATENT DOCUMENTS

| | | |
|---|---|---|
| CH | 684 602 | 10/1994 |
| DE | 413 95 49 | 6/1993 |
| DE | 44 25 874 A1 | 1/1996 |
| DE | 102 11 827 | 10/2003 |
| EP | 1 536 456 A1 | 6/2005 |
| JP | 57089464 A * | 6/1982 |
| JP | 04325679 A | 11/1992 |
| JP | 05230651 A | 9/1993 |
| JP | 07102366 A * | 4/1995 |
| JP | 09217173 A | 8/1997 |
| JP | 9-291360 | 11/1997 |
| JP | 2000129441 A | 5/2000 |
| JP | 2004-059990 A | 2/2004 |
| JP | 2004211133 A | 7/2004 |
| JP | 2006117995 A * | 5/2006 |
| TW | 525631 | 3/2003 |
| TW | 223242 B | 5/2005 |

* cited by examiner

*Primary Examiner* — Alexa Neckel
*Assistant Examiner* — Michael Band
(74) *Attorney, Agent, or Firm* — Fulbright & Jaworski L.L.P.

(57) ABSTRACT

A carrier for a substrate, wherein at least a part of the carrier contains a material with a coefficient of thermal expansion which is higher than the coefficient of thermal expansion of the substrate, wherein in a specified region of the carrier a bar is centrally fastened whose coefficient of thermal expansion is lower than that of the region on which it is fastened.

10 Claims, 4 Drawing Sheets

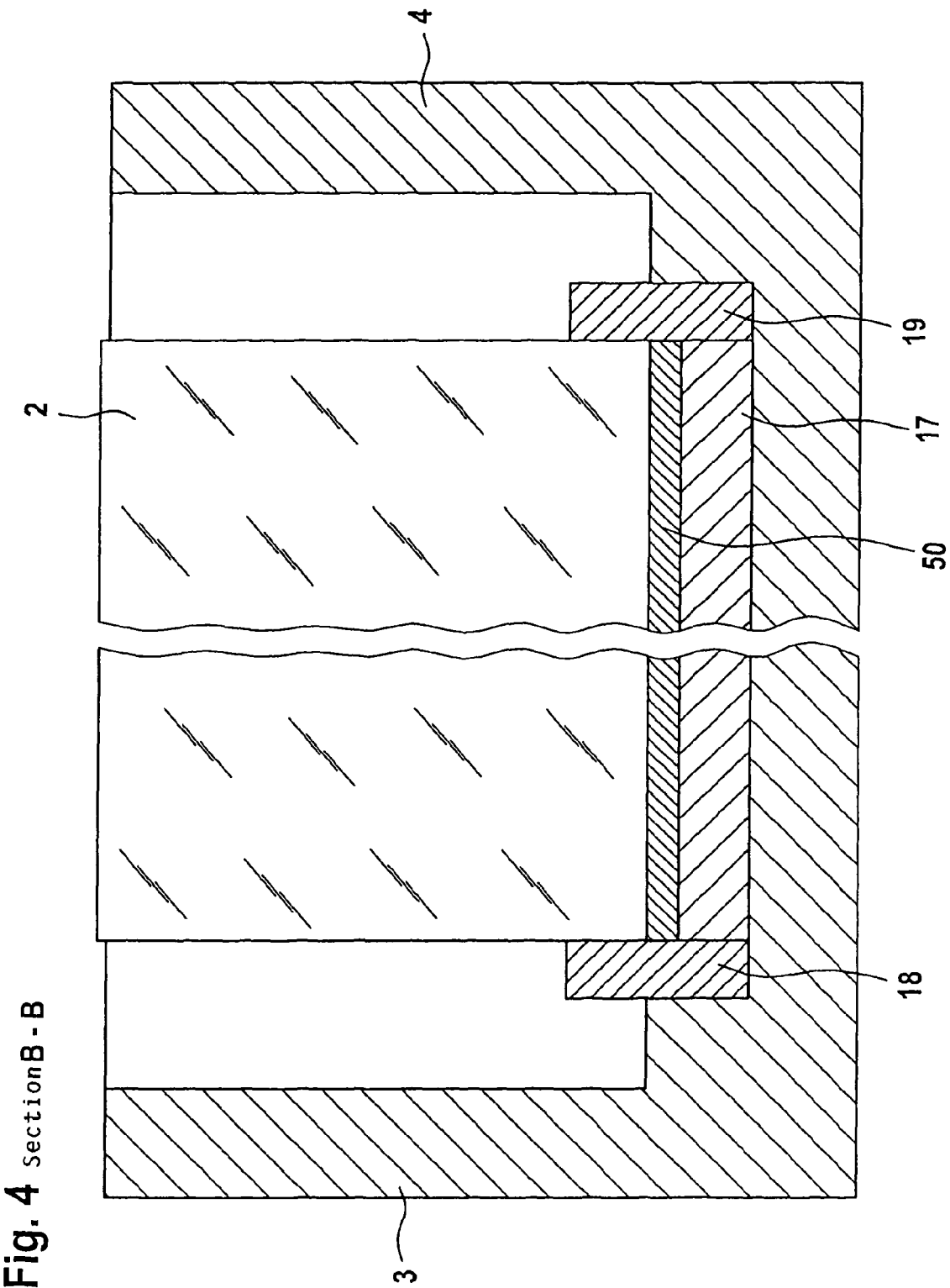

SUBSTRATE CARRIER

FIELD OF THE INVENTION

This application claims priority from German Patent Application No. 10 2005 045 718.5 filed Sep. 24, 2005, incorporated herein by reference in its entirety.

The invention relates to a substrate carrier.

BACKGROUND AND SUMMARY OF THE INVENTION

Substrates are often guided in sputter units past a so-called target, from the surface of which particles are sputtered off, which are deposited on the substrate. As the substrates can be utilized, for example, glass plates, which are transported through an inline sputter unit. These glass plates are set into a frame connected with a transport device.

A device for the transport of substrates into and through vacuum treatment units, for example, is known, which comprises a bulky foot part composed of two wheel sets correlated with one track and one support bearing (DE 41 39 549 A1). The substrates to be treated are herein held by means of a rectangular substrate holder.

Furthermore is known an annular substrate holder for the mounting of a round substrate plate, this substrate holder, in turn, being held by four equally distributed holding arms (DE 102 11 827 C1).

If the substrates held in frames have a coefficient of thermal expansion different from that of the frames, the substrates may be covered at the margins nonuniformly and onesidedly to too high a degree. In the case of wafers this is referred to as "edge exclusion", i.e. to a peripheral region of the wafer which is not coated.

The invention therefore addresses the problem of providing a carrier for substrates, in which the substrates are covered uniformly and not too thickly at the margin.

The problem is resolved according to the present invention, which relates in part to a carrier for a substrate, wherein at least parts of the carrier are comprised of a material having a coefficient of thermal expansion which is higher than the coefficient of thermal expansion of the substrate. To avoid, or at least decrease, nonuniform coating of the substrate at the margins, in particular during sputter processes, a bar is centrally connected with the carrier. This bar has a coefficient of thermal expansion lower than the region of the carrier at which it is fastened.

The advantage attained with the invention resides in particular therein that through the combination of lightweight cost-effective aluminum, which expands to a high degree, with a centering means of a material, which expands to a lesser degree, for example titanium, the "edge exclusion" is reduced.

An embodiment example of the invention is shown in the drawing and will be described in further detail below:

BRIEF DESCRIPTION OF THE FIGURES

FIG. 4 shows a section BB through the device of FIG. 3a.

DETAILED DESCRIPTION

Figure 1A:
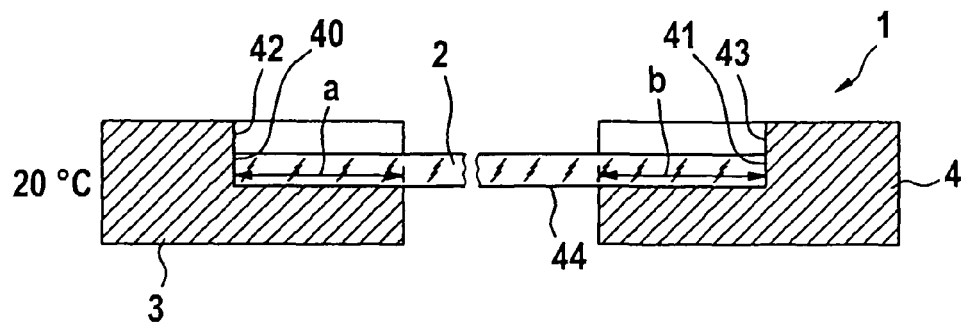
FIGS. 1a to 1c shows fundamental representation of a substrate carrier with a substrate at different thermal expansions.
Figure 1B:
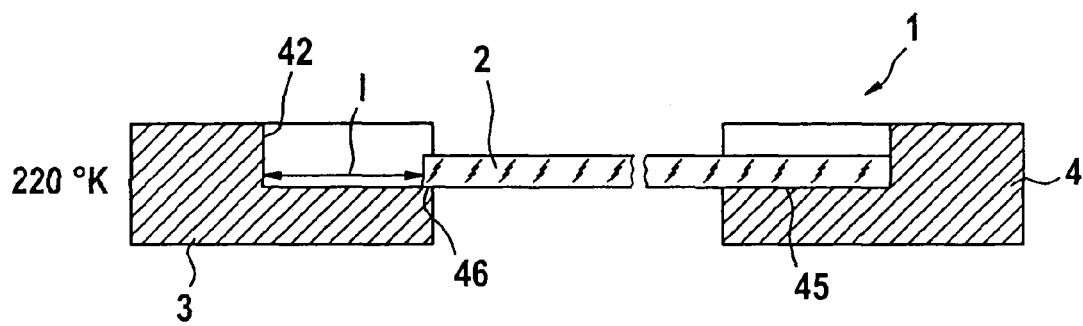
Figure 1C:
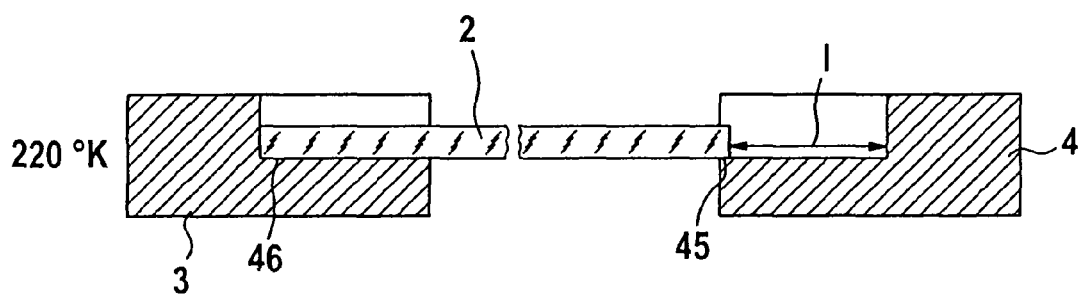

FIGS. 1a to 1c depict the principle of the support of an areal substrate 2 on bars 3, 4 of a conventional substrate carrier 1. The set of problems to be resolved will be demonstrated in conjunction with this figure. The substrate will be assumed to be glass, while the substrate carrier 1 is comprised of aluminum.

FIG. 1a shows the state at approximately 20° C. (0° C.=273.15° K, i.e. 20° C.=293.15° K). Ends 40, 41 of the substrate 2 abut projections 42, 43 of bars 3, 4. By 44 is denoted that side of substrate 2 which is to be coated. In the position depicted in FIG. 1a of the substrate 2 those regions a, b, which are covered by the bars 3, 4, would not be coated when sputtered. The regions a and b are of equal size.

However, sputtering takes place at a temperature which is, for example, higher by 220° K (=appr. 513.15° K), at which glass and aluminum expand differently. The illustrations of FIGS. 1b and 1c show the effect of this different expansion. The bars 3, 4 of aluminum, connected with one another—the connections are not shown—migrate considerably further toward the side than the substrate 2. Therein two different constellations may result, of which the one is depicted in FIG. 1b and the other in FIG. 1c.

As has been found in practice, one of the end regions 45, 46 of substrate 2 always rests more firmly on bars 3, 4 than does the other, with the result that one end region—in FIG. 1b the end region 46—moves away from projection 42, while the other end region 45 retains its original position.

The substrate 2 is hereby nearly completely coated in the end region 46, while the end region 45 remains uncoated, FIG. 1c illustrates the case in which the end region 46 remains in its original position, while the end region 45 migrates relative to bar 4.

In FIG. 1b consequently "edge exclusion" occurs in end region 45, in FIG. 1c, in contrast, in end region 46.

If the substrate is a glass plate of 1950 mm width, and if the temperature difference is, for example, $\Delta T=220°$ K, the thermal expansion of the glass is 1.6 mm and of aluminum the thermal expansion is 10.2 mm. Segment ∕is consequently 8.6 mm.

Figure 2:
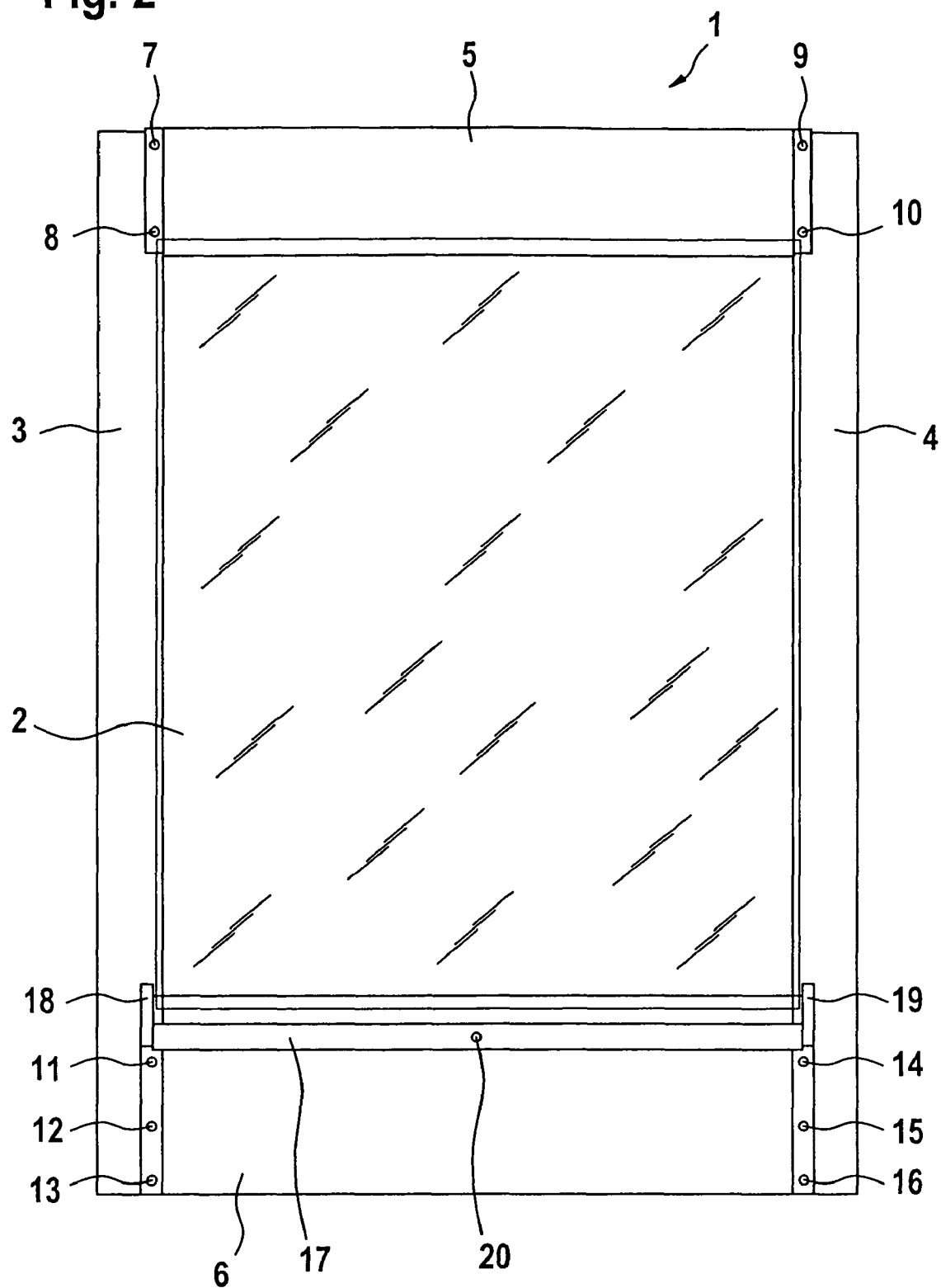
FIG. 2 shows a frame-form substrate carrier with a bar of a material with relatively low coefficient of thermal expansion, for example titanium.

FIG. 2 shows a substrate carrier 1 according to the invention with the substrate 2. Substrate 2 is again a glass plate. The substrate carrier 1 is formed essentially by a frame with two vertical bars 3, 4 and two horizontal plates 5, 6. The vertical bar 3, 4 are for example bar of titanium. However, they may also be comprised of another material. The horizontal plates 5, 6 preferably comprise aluminum and are connected with bolts or rivets 7, 8, 9, 10 or 11 to 16, respectively, with the ends of the vertical bars 3, 4. Closely beneath the substrate 2 extends a relatively thin bar 17 of titanium, which at each of its ends has an upwardly directed finger 18, 19. This bar 17 is centrally connected with bolts 20 or the like with the aluminum plate 6. In the aluminum plate 6 beneath bar 17 is provided a, not shown, groove by which the titanium bar 17 is guided.

If the substrate 2 without bar 17 and fingers 18, 19—i.e. residing only in contact on the aluminum plates 5, 6—is transported through a heated sputter chamber, the aluminum plates 5, 6 expand to a greater degree than the substrate 2 comprised of glass. Bars 3, 4 consequently move away from one another—as depicted in FIGS. 1a to 1c—which means that the substrate 2 is no longer delimited by these bars 3, 4. Substrate 2 can be on bar 3 with its left edge (cf. FIG. 1c) as well as with its right edge (cf. FIG. 1b) on bar 4. In neither case is it any longer located centrally with respect to bars 3, 4, which can lead to nonuniformly coated margins of substrate 2.

If, in contrast, the substrate is located between fingers 18, 19 of the titanium bar 17, the substrate 2 remains centered, since the titanium bar 17 is connected in its center with the center of the aluminum plate 6. The titanium bar 17 migrates symmetrically with respect to bolt 20 toward the left and the right.

Since titanium has a significantly lower coefficient of thermal expansion than aluminum, the substrate 2 shifts only slightly relative to fingers 18, 19. Consequently, it remains centered relative to the vertical bars 3, 4.

Figure 3A:
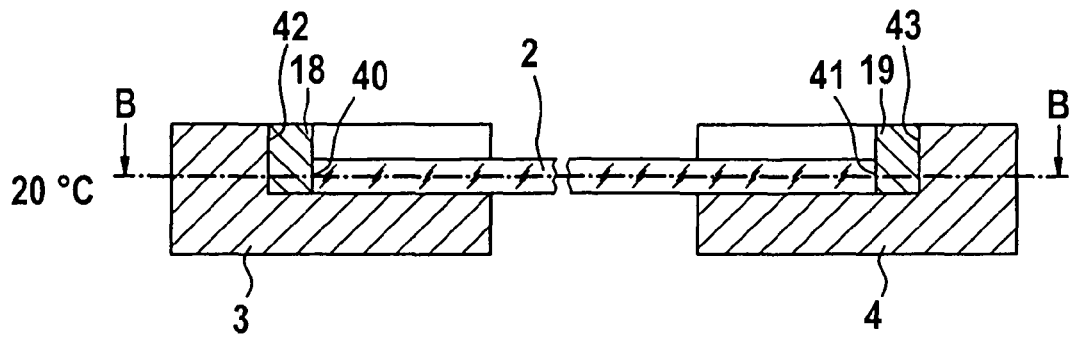
FIGS. 3a to 3c shows schematic illustrations to explain the operational function of the invention.
Figure 3B:
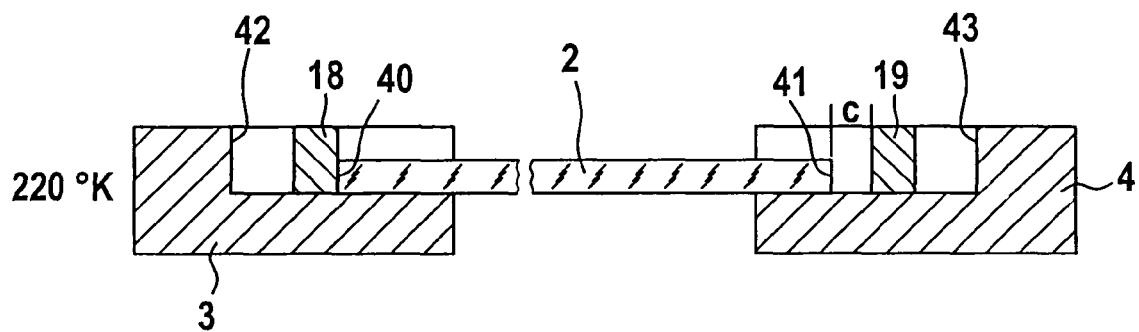
Figure 3C:
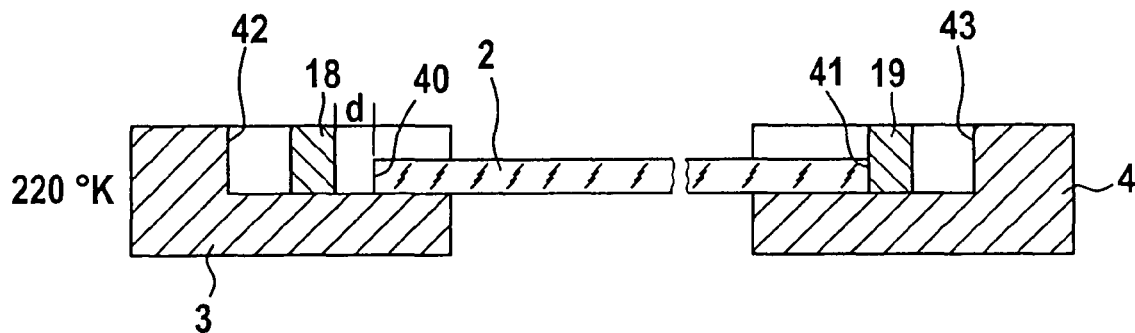

This is once again shown in principle in FIGS. 3a to 3c.

FIG. 3a shows the state at approximately 20° C. The fingers 18, 19 of titanium bar 17 abut, on the one hand, the projections 42, 43 and, on the other hand, the ends 40, 41 of the substrate.

At a temperature increased for example by 220° K, either the constellation according to FIG. 3b results or the constellation according to FIG. 3c.

Since with increasing heat titanium expands considerably less than aluminum, substrate 2 has only slight tolerance c or d, respectively, with respect to finger 19 or 18, respectively, of the titanium bar 17. The coating of substrate 2 is consequently significantly more uniform than in the case of FIG. 1b and 1c. At a temperature difference of 220° K the titanium bar 17 expands only by 3.5 mm at an assumed width. The distances c and d therewith are only 1.9 mm. Instead of titanium, other materials with lower thermal expansion can be utilized, for example ceramics, which are optionally reinforced with glass fibers.

In FIG. 4 a section B-B through the configuration according to FIG. 3a is shown. The fingers 18, 19 of titanium bar 17 are herein again evident. The frames 3, 4, 50 are herein comprised throughout of the same material, for example aluminum.

It is claimed:

1. A carrier for a substrate, wherein at least a part of the carrier comprises a material with a coefficient of thermal expansion which is higher than the coefficient of thermal expansion of the substrate, wherein in a specified region of the carrier a bar is centrally fastened whose coefficient of thermal expansion is lower than that of the region on which it is fastened.

2. The carrier as claimed in claim 1, wherein the bar has at its ends projections between which is located one end of the substrate.

3. The carrier as claimed in claim 1, wherein the carrier is implemented in the form of a frame.

4. The carrier as claimed in claim 1, wherein at least parts of the carrier comprise aluminum.

5. The carrier as claimed in claim 1, comprising two vertical bars and two horizontal plates, wherein the horizontal plates comprise aluminum.

6. The carrier as claimed in claim 5, wherein the two vertical bars are comprised of titanium.

7. The carrier as claimed in claim 1, wherein the substrate is a glass plate.

8. The carrier as claimed in claim 1, wherein the bar fastened on the carrier is comprised of titanium.

9. The carrier as claimed in claim 5, wherein the horizontal plates are connected with the ends of the vertical bars of the carrier and the bar is centrally connected with the lower of the horizontal plates.

10. The carrier as claimed in claim 1, wherein the plate on which the bar is disposed comprises a horizontal guide for the bar.

\* \* \* \* \*